(12) United States Patent
Abeyasekera et al.

(10) Patent No.: US 10,483,865 B2
(45) Date of Patent: Nov. 19, 2019

(54) CONVERTERS FOR WIND TURBINE GENERATORS

(71) Applicant: VESTAS WIND SYSTEMS A/S, Aarhus N (DK)

(72) Inventors: Tusitha Abeyasekera, Aarhus N (DK); Duy Duc Doan, Tilst (DK); Lars Helle, Suldrup (DK); Allan Holm Jørgensen, Aalborg Ø (DK); John Godsk Nielsen, Hornslet (DK); Søren Andersen, Tilst (DK)

(73) Assignee: VESTAS WIND SYSTEMS A/S, Aarhus N (DK)

( * ) Notice: Subject to any disclaimer, the term of this patent is extended or adjusted under 35 U.S.C. 154(b) by 0 days.

(21) Appl. No.: 15/030,316

(22) PCT Filed: Oct. 14, 2014

(86) PCT No.: PCT/DK2014/050331
§ 371 (c)(1),
(2) Date: Apr. 18, 2016

(87) PCT Pub. No.: WO2015/055211
PCT Pub. Date: Apr. 23, 2015

(65) Prior Publication Data
US 2016/0241153 A1    Aug. 18, 2016

(30) Foreign Application Priority Data

Oct. 18, 2013  (DK) .................................. 2013 70597

(51) Int. Cl.
*H02M 5/42*  (2006.01)
*H02J 3/28*  (2006.01)
(Continued)

(52) U.S. Cl.
CPC .............. *H02M 5/42* (2013.01); *F03D 9/255* (2017.02); *H02H 3/105* (2013.01); *H02H 7/122* (2013.01);
(Continued)

(58) Field of Classification Search
CPC ............ H02M 5/42; H02M 1/12; H02M 1/32; H02M 7/493; H02M 5/4585; H02M 7/219;
(Continued)

(56) References Cited

U.S. PATENT DOCUMENTS 5,687,071 A     11/1997  Debruyne et al.
7,339,474 B2 *   3/2008  Easley ................. G08B 13/122
                                                    256/10
(Continued)

FOREIGN PATENT DOCUMENTS

CN    101465606 A    6/2009
CN    101588064 A    11/2009
(Continued)

OTHER PUBLICATIONS

International Search Report for PCT/DK2014/050331, dated Jan. 5, 2015.
(Continued)

*Primary Examiner* — Jung Kim
(74) *Attorney, Agent, or Firm* — Patterson + Sheridan, LLP

(57) ABSTRACT

A wind turbine generator 1 supplies three-phase a.c. current of variable voltage and variable frequency to two pairs of rectifiers 4a, 4b and 4c, 4d which generate respective d.c. outputs connected to positive, negative and neutral d.c. conductors 6, 7, 8. The outputs from each pair of rectifiers are connected together, and the outputs from the two pairs are connected in series to create a high-voltage d.c. output.

(Continued)

Inverters 10a, 10b, 10c, 10d then convert the d.c. power to a.c. at a fixed frequency and voltage suitable for connection to the mains grid. To reduce the effect of common-mode noise, a capacitor is connected between the 1 neutral conductor 7 and earth, and a respective filter circuit 30 is connected between each of the a.c. outputs of the inverters 10a, 10b, 10c, 10d and earth. To reduce the effect of voltage surges during lightning, a surge protection device is also connected between the neutral d.c. conductor 7 and earth. Any imbalance in the current in the positive and negative conductors 6, 8 is compensated by detecting the presence of current flowing in the neutral conductor 7. Power supplied to auxiliary circuits from the output of one of the inverters, e.g. 10a, of the wind turbine is measured, and any resulting imbalance between the current in the positive and negative conductors is compensated. In the event of an earth-leakage fault in the conductors connecting the a.c. outputs of the inverters to the grid, when isolated, isolation detection relays 25 are provided.

20 Claims, 3 Drawing Sheets

(51) Int. Cl.

| | | |
|---|---|---|
| *H02J 3/38* | (2006.01) | |
| *H02M 5/458* | (2006.01) | |
| *H02M 7/219* | (2006.01) | |
| *H02M 7/493* | (2007.01) | |
| *H02H 3/10* | (2006.01) | |
| *H02H 7/122* | (2006.01) | |
| *H02M 1/12* | (2006.01) | |
| *H02M 1/32* | (2007.01) | |
| *H03H 7/01* | (2006.01) | |
| *F03D 9/25* | (2016.01) | |
| *H02M 7/48* | (2007.01) | |
| *H02M 7/23* | (2006.01) | |
| *H02M 1/00* | (2006.01) | |
| *G01R 31/40* | (2014.01) | |

(52) U.S. Cl.
CPC ............... *H02J 3/28* (2013.01); *H02J 3/386* (2013.01); *H02M 1/12* (2013.01); *H02M 1/32* (2013.01); *H02M 5/4585* (2013.01); *H02M 7/219* (2013.01); *H02M 7/493* (2013.01); *H03H 7/0107* (2013.01); *G01R 31/40* (2013.01); *H02M 7/23* (2013.01); *H02M 2001/0077* (2013.01); *H02M 2001/123* (2013.01); *H02M 2007/4822* (2013.01); *Y02E 10/725* (2013.01); *Y02E 10/726* (2013.01); *Y02E 10/763* (2013.01); *Y02E 10/766* (2013.01); *Y02E 70/30* (2013.01)

(58) Field of Classification Search
CPC ............. H02M 7/23; H02M 2001/123; H02M 2001/0077; H02M 2007/4822; F03D 9/255; H03H 7/0107; H02H 3/105; H02H 7/122; H02J 3/28; H02J 3/386; Y02E 70/30; Y02E 10/763; Y02E 10/725; Y02E 10/766; Y02E 10/726; G01R 31/40
See application file for complete search history.

(56) References Cited

U.S. PATENT DOCUMENTS

| | | |
|---|---|---|
| 2005/0146226 A1 | 7/2005 | Trainer et al. |
| 2005/0151520 A1 | 7/2005 | Schreiber |
| 2009/0147423 A1 | 6/2009 | Mulligan et al. |
| 2009/0212568 A1 | 8/2009 | Maibach et al. |
| 2012/0133142 A1* | 5/2012 | Langel ............... F03D 80/82 290/55 |
| 2012/0181871 A1* | 7/2012 | Johansen ............ H02J 9/062 307/66 |
| 2012/0300510 A1 | 11/2012 | Jensen et al. |
| 2013/0050885 A1* | 2/2013 | Chen ................... H02H 9/04 361/56 |
| 2013/0197704 A1 | 8/2013 | Pan et al. |

FOREIGN PATENT DOCUMENTS

| | | | | |
|---|---|---|---|---|
| CN | 101640423 A | | 2/2010 | |
| CN | 101834538 A | | 9/2010 | |
| CN | 101860231 A | | 10/2010 | |
| CN | 201726148 U | | 1/2011 | |
| CN | 202395465 U | | 8/2012 | |
| CN | 202395465 U | * | 8/2012 | ............. H02M 7/49 |
| CN | 102801176 A | | 11/2012 | |
| CN | 103095053 A | | 5/2013 | |
| CN | 103312189 A | | 9/2013 | |
| DE | 202006018439 U1 | | 2/2007 | |
| EP | 2182623 A1 | | 5/2010 | |
| EP | 2477301 A1 | | 7/2012 | |
| EP | 2528184 A1 | | 11/2012 | |
| ES | 2264367 A1 | | 12/2006 | |
| JP | H05300645 A | | 11/1993 | |
| JP | 2008109748 A | | 5/2008 | |
| JP | 2013021849 A | | 1/2013 | |
| WO | 0152379 A2 | | 7/2001 | |

OTHER PUBLICATIONS

Danish Search Report for PA 2013 70597, dated Jun. 3, 2014.
European Patent Examination for Application No. 14 786 792.1-1201 dated Apr. 30, 2018.
European Search Examination for Application No. 14 786 792.3-1201 dated Nov. 20, 2018.
State Intellectual Property Office (SIPO) of the People's Republic of China for Application No. 201480057157.6 dated Nov. 3, 2017.

* cited by examiner

CONVERTERS FOR WIND TURBINE GENERATORS

The present invention relates to wind turbine generators, and in particular to converters used in wind turbine generators.

Wind turbine generators are conventionally arranged to generate three-phase a.c. power at a variable voltage and a variable frequency in dependence on wind speed. In order to transmit the generated power to the mains electricity grid, the voltage and the frequency of the generated power must both be converted to well-defined values suitable for the grid. To achieve this, the three-phase a.c. current generated by the wind turbine is first converted to a d.c. current and subsequently converted to three-phase a.c. current at a voltage and frequency suitable for the grid. This conversion typically occurs within the wind turbine generator housing, referred to as the nacelle, which is supported at the top of a tower.

A typical converter comprises a single rectifier which converts the three-phase a.c. voltage from the wind turbine to a d.c. voltage, and a corresponding single inverter which converts the d.c. voltage to the three-phase a.c. voltage level required by the grid.

Although the terms, "rectifier" and "inverter" are used herein to refer respectively to devices which convert a.c. power to d.c. power and d.c. power to a.c. power, in practice such rectifiers and inverters are substantially identical in structure and are used to convert both from a.c. to d.c. and from d.c. to a.c. Indeed, it is normal, under certain conditions, for wind turbine generators to be supplied with power from the electricity grid, which would require what are described herein as "inverters" to act as rectifiers and what are described herein as "rectifiers" to act as inverters. Correspondingly, the terms, "input" and "output" are used herein to refer to power transfer in the direction from the wind turbine generator to the mains grid. Clearly, these terms would have the opposite meaning when considering power transfer in the reverse direction, i.e. from the grid to the wind turbine.

There is an upper limit to the power level which can be handled by rectifiers and inverters, and the above conventional arrangement is therefore restricted to wind turbine generators which generate power below this limit.

It would therefore be desirable to provide arrangements which overcome, or at least mitigate this problem. It would also be desirable to provide arrangements which reduce current losses in the conductors which carry the a.c. current generated by the wind turbine.

Thus, in accordance with a first aspect of the present invention there is provided a system for converting an a.c. voltage output from a wind turbine generator to a d.c. voltage, the system comprising first and second rectifiers each connected to the output of the wind turbine generator and arranged to generate a respective d.c. output, wherein: the positive d.c. level output from the first rectifier is applied to a first, positive d.c. conductor; the negative d.c. level output from the first rectifier is connected together with the positive d.c. level output from the second rectifier and applied to a second, neutral d.c. conductor; and the negative d.c. level output from the second rectifier is applied to a third, negative d.c. conductor, the first, second and third d.c. conductors being arranged to transmit the resulting d.c. voltages.

With such an arrangement, the power generated by the wind turbine is divided between two rectifiers, which means that an increased power level can be converted as compared with the conventional arrangement in which only a single rectifier is used. Furthermore, since the current generated by the wind turbine is split into two current paths, the current losses within each path are reduced as compared with the conventional arrangement in which the entire current generated by the wind turbine is supplied to a single rectifier.

Each three-phase output of the wind turbine generator is preferably generated from a different respective set of windings of the turbine, since this reduces the current load within each set of windings, which in turn enables the windings to be formed from wire having a smaller diameter, with consequent cost savings.

The arrangement gives rise to a d.c. voltage at twice the magnitude of the d.c. voltage with the conventional arrangement using only a single rectifier, and also provides a neutral d.c. conductor of intermediate voltage. Many advantages arise out of such an arrangement, as will be described below.

For example, the resulting d.c. voltage is twice that obtained with the conventional arrangement, and this provides the advantage that, for a given level of power transfer, the magnitude of the current is halved, thereby reducing current losses. Again, this means that the thickness, and hence also the weight and cost, of the d.c. conductors can be reduced as compared with conventional arrangements.

The system preferably further comprises third and fourth rectifiers, each connected to the output of the wind turbine generator, wherein the d.c. output of the third rectifier is connected to the d.c. output of the first rectifier and the d.c. output of the fourth rectifier is connected to the d.c. output of the second rectifier.

This provides the advantage that the power generated by the wind turbine is handled by four rectifiers, and therefore a significantly greater level of power can be generated by the wind turbine, as compared with conventional arrangements having only a single rectifier. Furthermore, since the current generated by the wind turbine is split into four current paths, the current losses within each path are reduced as compared with the conventional arrangement in which the entire current generated by the wind turbine is supplied to a single rectifier. Again, this reduces the thickness of the conductors.

Means are preferably provided for selectively disconnecting each rectifier from the output of the wind turbine generator.

In a preferred arrangement, such means are arranged for selectively disconnecting either (a) the combination of the first and third rectifiers or (b) the combination of the second and fourth rectifiers from the output of the wind turbine generator.

With such a system, when one of the rectifiers develops a fault, two rectifiers (including the faulty rectifier) can be disconnected, and conversion of the generated a.c. power is still possible by using the remaining functional pair of rectifiers.

Although the above systems could be used to generate d.c. power, it is desirable for the generated power to be in the form of an a.c. voltage suitable for connection to a mains electricity grid.

Thus, for each rectifier there is preferably provided a corresponding inverter for converting the d.c. output of the corresponding rectifier to an a.c. output of predetermined frequency, and preferably also of predetermined voltage. Thus, each inverter is supplied with d.c. current from the neutral d.c. conductor and either the positive d.c. conductor or the negative d.c. conductor.

Means are preferably provided for selectively disconnecting each inverter.

In a preferred arrangement, such means are arranged for selectively disconnecting either (a) the combination of the first and third inverters or (b) the combination of the second and fourth inverters from the output of the wind turbine generator.

Thus, if one of the inverters develops a fault, two of the inverters (including the faulty inverter) can be disconnected, and conversion of the d.c. power to a.c. power is still possible using the remaining functional pair of inverters.

Thus, the system may be arranged to disconnect each of the inverters when the corresponding rectifier is disconnected, and to disconnect each of the rectifiers when the corresponding inverter is disconnected.

With such an arrangement, in the event of a fault occurring in the first rectifier, the first and third rectifiers and the first and third inverters would be disconnected, leaving only the functioning second and fourth rectifiers and the functioning second and fourth inverters connected.

Wind turbine generators typically require a source of power to maintain auxiliary circuits which perform various safety and control functions, and this power is typically extracted from the power supplied to the grid from the wind turbine itself. With such an arrangement, in which there are at least two inverters, it is desirable for power to be supplied to the auxiliary circuits from the output of only one of the inverters. In this case, the power supplied from that inverter will therefore be less than that supplied from the other inverter or inverters. The system therefore preferably further comprises means for measuring the power supplied to the auxiliary circuits and, in response thereto, controlling at least one of the rectifiers and inverters to at least partially balance the level of a.c. power supplied to the grid from the a.c. outputs.

Rectifiers and inverters which are typically used with wind turbine generators function using pulse-width modulation technology which involves high-frequency switching, typically at a frequency of 2 kHz.

One problem arising out of this technology is the generation of high-frequency a.c. noise which appears on each of the conductors which supply the a.c. output from the wind turbine generators to the rectifiers. (Although the switching itself is only at 2 kHz, the resulting square-wave pulse-width modulation signal includes components at much higher frequencies.) This noise appears with the same polarity on all of the a.c. output conductors from the wind turbine and is therefore referred to as "common-mode" noise. Since this noise can give rise to undesirable electromagnetic interference, it would be beneficial to reduce the level of this noise.

A conventional arrangement for reducing common-mode noise is to surround the conductor which carries the generated a.c. current from the wind turbine with a conductive coil having magnetic properties suitable for absorbing the noise. A similar coil is also used with the a.c. current supplied from the inverter. However, such coils are not only expensive but also give rise to substantial heat loss and add considerable weight to the equipment carried within the nacelle.

Is has been found that this common-mode noise originating in the rectifiers bleeds through the rectifiers and appears on all three d.c. conductors. Indeed, from a common-mode viewpoint, the positive, negative and neutral d.c. conductors are all equivalent.

It would be possible to reduce the level of common-mode noise simply by providing a d.c. conductive path between the neutral d.c. conductor and an earth connection in the nacelle, which would be a cost-effective way of providing a short circuit for the common-mode noise to ground. However, since such an earth connection in a wind turbine generator is via the tower, the resulting d.c. current would give rise to accelerated galvanic corrosion within the connecting bolts of the nacelle.

In order to reduce common-mode noise without causing significant galvanic corrosion, the system preferably comprises a low-impedance path for the undesirable a.c. common-mode noise between the neutral d.c. conductor and earth, which substantially blocks the passage of d.c. current.

The low-impedance path may advantageously be formed simply by connecting a capacitor between the neutral d.c. conductor and earth, which, as is well known, permits the passage of a.c. current but blocks d.c. current.

Wind turbine generators are subject to lightning strikes, which can affect the electrical operation. In particular, a lightning strike can give rise to a destructive voltage surge on one or more of the d.c. conductors, which could damage the sensitive power electronics.

Therefore, the system preferably comprises a surge protection device connected between the neutral d.c. conductor and earth.

The surge protection device preferably comprises means defining a current path only when the voltage in the neutral d.c. conductor exceeds a predetermined level, such as would arise with a lightning strike, and this may be in the form of a semiconductor comprising metal oxide. Since any voltage surge occurring on either the positive or negative d.c. conductors would result in a corresponding voltage surge on the neutral d.c. conductor, this provides a convenient way of avoiding the damaging effects of a voltage surge appearing on any of the three d.c. conductors.

Furthermore, the system preferably comprises a negative feedback servo-control system comprising means for sensing the presence of current flowing in the neutral d.c. conductor, which would occur when there is an imbalance in the current flowing in the positive and negative d.c. conductors, and, in response thereto, controlling the rectifiers and, where present, also the inverters, so as to balance the current flowing in the positive and negative d.c. conductors, thereby to reduce the current flowing in the neutral d.c. conductor.

Such an imbalance, if left uncorrected, would give rise to an asymmetrical power distribution in the rectifiers and, where present, also the inverters, leading to premature ageing.

With conventional arrangements having only a single rectifier and single inverter, both the rectifier and the inverter are located within the nacelle. Furthermore, a transformer is used to step up the a.c. voltage output of the inverter to a level suitable for connection to the grid, and this is also located within the nacelle. In view of the substantial weight of this equipment, it would be desirable to locate at least a part of this equipment outside the nacelle, preferably at the base of the tower supporting the nacelle. However, the low level of both the generated a.c. voltage and the resulting d.c. voltage would give rise to undesirably high current losses if any part of the conversion equipment were located remotely from the wind turbine generator. It will be appreciated that, for a given power level, the greater the voltage the lower the current, and hence also current losses. Furthermore, with conventional arrangements in which the a.c. and d.c. conductors must carry relatively high levels of current, it follows that both the a.c. and d.c. conductors must have a relatively large diameter which, in turn, would hinder rotation of the nacelle about the tower axis if these conductors were to extend from the nacelle to the base of the tower. Such yaw rotation of the nacelle is normally required to enable the blades of the wind turbine generator always to face the direction of the wind and thereby maximise power output.

Thus, in a preferred embodiment, the first and second rectifiers are located in the nacelle, but the inverters are located in the tower, preferably at the base of the tower. With this arrangement, the transformer is also located remote from nacelle.

In this arrangement, since the d.c. voltage is twice that of the conventional arrangement having only a single rectifier and single converter, the d.c. current is reduced by one half for a given power level, and so the d.c. conductors can run the full height of the tower without incurring significant losses. As a result, the inverters can be located, together with the transformer, at the base of the tower. This reduces the amount of equipment carried in the nacelle, which, in turn reduces the torsional stresses on the nacelle during yaw rotation.

In embodiments of the present invention in which inverters are provided, a respective switched resistance, or "chopper resistance", may be provided across the d.c. terminals of each rectifier and each inverter. These function, in addition to absorbing excess power in the d.c. conductors, to reduce any excess d.c. voltage appearing on the d.c. conductors. Such excess power may result from a resonance loop caused by the self-inductance of the d.c. conductors and the banks of capacitors typically forming part of the rectifier and inverter circuitry. The chopper resistance dissipates the energy by dampening such resonance. The terms "switched resistor" and "chopper resistor" are used herein interchangeably.

By providing separate chopper resistors for the rectifiers and inverters, this provides more effective damping of d.c. oscillations than if chopper resistors were provided across the terminals of only the rectifiers. Indeed, the activation of a single chopper resistor located between the rectifier and inverter could itself give rise to undesirable oscillations. This is especially the case when there is considerable separation between the rectifiers and inverters, as with preferred embodiments of the present invention in which the rectifiers are located at or near the top of a tower and the inverters are located at or near the bottom of the tower.

Such chopper resistances are heavy and also generate considerable heat which must be dissipated. By splitting the chopper resistance between the top and bottom of the tower in this way, this enables at least some of the weight of the chopper resistances, and also the necessary heat dissipation, to be removed from the top of the tower.

Thus, in the preferred arrangement in which the inverters are located at the base of the tower, the magnitude of the switched resistance provided across each of the inverters is preferably substantially greater than, and preferably substantially twice that provided across each of the rectifiers. Since most of the weight of the switched resistances is no longer within the nacelle, the torsional stresses during yaw rotation of the nacelle are reduced considerably, and the heat generated from the bulk of the switched resistances can readily be dissipated from the base of the tower.

The problem of common-mode noise referred to above also arises from the high-frequency switching within the inverters and also appears not only on the a.c. outputs of the inverters but also on the three d.c. conductors.

To reduce the level of such common-mode noise, the system preferably further comprises means connected to the a.c. output of each of the inverters for reducing the level of common-mode a.c. noise appearing on the respective a.c. output. This can be provided in addition, or as an alternative, to the capacitor arrangement described above.

This noise-reducing means preferably comprises a filter circuit connected to the neutral d.c. conductor. The filter circuit can take the form of an inductance connected to a capacitor, connected, in turn, to the neutral d.c. conductor. The effect of the filter circuit is to reduce the level of common-mode a.c. noise.

The circuitry which connects the a.c. outputs of the inverters to the grid is preferably arranged to be isolated from the inverters under certain conditions, such as during periods of low, or zero, wind speed. In conventional systems having no neutral d.c. conductor, this circuitry is connected to earth. However, in some embodiments of the present invention, there is no earth connection, since this could give rise to undesirable earth loops, and the disconnected circuitry can remain at high voltage. In this case, it would be possible for an earth-leakage fault to arise within the isolated circuitry which would not be detected by the control systems associated with the rectifiers and inverters. Thus, in a preferred arrangement, means are provided for detecting the occurrence of such a short circuit, and, in response thereto, generating an alarm signal, which would enable service personnel to rectify the fault either manually or remotely. The preferred detecting means takes the form of an isolation detection relay which detects when the electrical resistance between the circuitry and earth falls below a predetermined value.

Whereas some of the preferred features of the present invention have been described in relation to arrangements with more than one rectifier and more than one inverter, some of these could also be applied to conventional arrangements having only a single rectifier-inverter pair.

Thus, in accordance with a further aspect of the present invention there is provided a system for converting an a.c. voltage output from a wind turbine generator to a d.c. voltage, the d.c. voltage appearing across first and third conductors, with an intermediate d.c. voltage appearing on a second, neutral conductor, further comprising means electrically connected to the neutral conductor for reducing high-frequency common-mode noise on the neutral by providing an a.c. conductive path between the neutral conductor and earth which substantially blocks the passage of d.c. current.

In one arrangement, the noise-reducing means comprises a capacitor connected between the neutral d.c. conductor and earth.

In a further arrangement, which further comprises an inverter for converting the d.c. voltage to a.c. voltage, the noise-reducing means comprises a filter circuit connected between the a.c. output of the inverter and the neutral d.c. conductor. This could be provided in addition to the capacitor connected between the neutral d.c. conductor and earth.

In accordance with a further aspect of the present invention there is provided a system for converting an a.c. voltage output from a wind turbine generator to a d.c. voltage, the d.c. voltage appearing across first and third conductors, with an intermediate d.c. voltage appearing on a second, neutral conductor, further comprising means for sensing the presence of current flowing in the neutral conductor resulting from an imbalance in the current flowing in the first and third conductors and, in response thereto, balancing the level of current within the first and third conductors.

In accordance with a further aspect of the present invention there is provided a system for converting an a.c. voltage output from a wind turbine generator to a d.c. voltage, the d.c. voltage appearing across first and third conductors, with an intermediate d.c. voltage appearing on a second, neutral conductor, the system further comprising means for sensing the presence of an abnormally high voltage on the neutral conductor, and, in response thereto, providing a conductive path between the neutral conductor and earth.

In this case, the sensing means preferably comprises a surge protection device which defines a current path only when the voltage in the neutral d.c. conductor exceeds a predetermined level.

In accordance with a further aspect of the present invention there is provided a system for converting an a.c. voltage output of variable frequency from a wind turbine generator to an a.c. voltage of predetermined frequency for connecting to an electricity grid, wherein power is supplied to auxiliary circuits for the wind turbine generator from the a.c. output supplied to the grid, the system comprising rectifying means for converting the variable-frequency a.c. output to respective first and second d.c. voltages, the first d.c. voltage appearing across a first, positive, conductor and a second, neutral, conductor, and the second d.c. voltage appearing across the second, neutral conductor and a third, negative, conductor, and inverting means for converting the resulting d.c. voltages to first and second a.c. outputs, wherein the power is supplied to the auxiliary circuits from only the first a.c. output, such that the resulting power available to the grid from the first a.c. output is less than that from the second a.c. output, the system comprising means for measuring the power supplied to the auxiliary circuits and, in response thereto, controlling at least one of the rectifying means and the inverting means to at least partially balance the level of a.c. power supplied to the grid from the first and second a.c. outputs.

In accordance with a further aspect of the present invention there is provided a method of converting an a.c. voltage output from a wind turbine generator to a d.c. voltage, the method comprising connecting first and second rectifiers to the output of the wind turbine generator so as to generate a respective d.c. output, applying the positive d.c. level output from the first rectifier to a first, positive d.c. conductor; connecting the negative d.c. level output from the first rectifier together with the positive d.c. level output from the second rectifier to a second, neutral d.c. conductor; and applying the negative d.c. level output from the second rectifier to a third, negative d.c. conductor, the first, second and third d.c. conductors being arranged to transmit the resulting d.c. voltages.

In accordance with a further aspect of the present invention there is provided a system for converting an a.c. voltage output of variable frequency from a wind turbine generator to an a.c. voltage of substantially constant frequency, the wind turbine generator being supported at the top of a tower, the system comprising first and second rectifiers each connected to the output of the wind turbine generator and arranged to generate a respective d.c. output, the d.c. outputs being stacked to create a positive d.c. output, a neutral d.c. output and a negative d.c. output, connected respectively to positive, neutral and negative d.c. conductors, the first, second and third d.c. conductors, the system further comprising first and second corresponding stacked inverters connected to the d.c. conductors for converting the d.c. output of each of the first and second rectifiers to an a.c. output voltage of substantially constant frequency, wherein the rectifiers are located at or near the top of the tower and the inverters are located remotely from the rectifiers at or near the foot of the tower, the d.c. conductors extending along substantially the full height of the tower.

The rectifiers are preferably connected to respective mutually electrically isolated windings of the wind turbine generator. Similarly, the inverters are preferably connected to respective mutually electrically isolated windings of an output transformer. Thus, any fault appearing on one of the windings will affect only a single rectifier or inverter.

Advantageously, the cross-sectional area of the second, neutral d.c. conductor is substantially less than that of the first, positive and third, negative d.c. conductors. Since the current carried by the neutral d.c. conductor will normally be substantially less than that in the positive and negative cables, this feature balances to at least some extent the current density, i.e. the current per unit cross-sectional area, within the three cables.

Each rectifier and corresponding inverter preferably has an associated energy storage means, which may be in the form of dc-link capacitor banks.

The system preferably further comprises a respective switched, or chopper resistor associated with each rectifier and each inverter.

In accordance with a further aspect of the present invention there is provided a system for converting an a.c. voltage output from a wind turbine generator to a d.c. voltage, the system comprising first and second rectifiers each connected to the output of the wind turbine generator and arranged to generate a respective d.c. output, the d.c. outputs being stacked to create a positive d.c. output, a neutral d.c. output and a negative d.c. output, connected respectively to a positive d.c. conductor, a neutral d.c. conductor and a negative d.c. conductor, the system further comprising control means for independently controlling the power output of the first and second rectifiers. Thus, any difference in the power generated by the outputs supplied to the first and second rectifiers by the wind turbine can be compensated.

Such control means may be arranged to compensate for oscillations appearing on the d.c. conductors.

The control means is preferably arranged to inactivate the rectifiers when the d.c. current in the neutral d.c. conductor exceeds a predetermined level.

The system preferably further comprises at least one independently controllable switched, or chopper resistor associated with each of the rectifiers.

The control means may be arranged to control the low-voltage run-through independently for each rectifier.

Alternatively, or in addition, the control means may be arranged to control the production or reactive power independently for each rectifier.

Alternatively, or in addition, the control means may be arranged to control the d.c. link voltage output of each rectifier independently.

The system preferably further comprises corresponding first and second inverters connected to the d.c. outputs of the first and second rectifiers for generating an a.c. output, wherein the control means is further arranged to control the pulse width of each inverter independently thereby to reduce the level of harmonics generated.

In accordance with a further aspect of the present invention there is provided a system for converting an a.c. voltage output of variable frequency from a wind turbine generator to an a.c. voltage of substantially constant frequency, the wind turbine generator being supported at the top of a tower, the system comprising at least one rectifier each connected to the output of the wind turbine generator and arranged to generate a d.c. output across at least two d.c. conductors which are arranged to transmit the resulting d.c. output voltages, the system further comprising at least one corresponding inverter connected to the d.c. conductors for converting the d.c. output of the at least one rectifier to an a.c. output voltage of substantially constant frequency, wherein the at least one rectifier is located at or near the top of the tower and the at least one inverter is located remotely from the rectifiers at or near the foot of the tower, the d.c. conductors extending along substantially the full height of the tower, further comprising a respective switched, or chopper resistor associated with the or each rectifier and with the or each inverter.

The chopper resistor associated with the or each rectifier preferably has a substantially lower resistance than the chopper resistor associated with the or each inverter. In the preferred embodiment, the resistance of the chopper resistor associated with the or each inverter is twice that of the chopper resistor associated with the or each rectifier.

The chopper resistor associated with the or each rectifier preferably has a substantially higher d.c. voltage threshold than that of the chopper resistor associated with the or each inverter. The effect of this is that, for voltage spikes occurring on the d.c. conductors which are higher than the voltage threshold of the inverter chopper resistors but less than the voltage threshold of the rectifier chopper resistors, the necessary smoothing or damping is effected using only the inverter chopper resistors.

Each switched resistor is preferably arranged to be selectively activated, so as to be responsive to an abnormal condition occurring on the d.c. conductor to which it is connected.

Each switched resistor may be arranged to be activated in response to an abnormally high voltage level on one or more of the d.c. conductors, so as to reduce the voltage level by way of negative feedback.

In particular, the switched resistors associated with the rectifiers are preferably arranged to be activated in response to an abnormally high voltage level on one or more of the d.c. conductors at or near the top of the tower, since these are the nearest switched resistors to the detected abnormal condition.

Correspondingly, the switched resistors associated with the inverters are preferably arranged to be activated in response to an abnormally high voltage level on one or more of the d.c. conductors at or near the foot of the tower, again since these are the nearest switched resistors to the detected abnormal condition.

Furthermore, the switched resistors associated with the rectifiers are preferably arranged to be activated in response to an abnormally high voltage level on one of more of the d.c. conductors at or near the foot of the tower. This enables all switched resistors to be activated when an abnormal condition is detected at the foot of the tower.

Such an abnormal voltage level can be detected by the switched resistors associated with the inverters which can, in response generate a signal indicating the abnormal condition. Thus, the switched resistors associated with the rectifiers are preferably arranged to be activated in response to such a signal generated by one or more of the switched resistors associated with the inverters.

In order to transmit this signal, it is desirable for the system to comprise a high-speed link.

Furthermore, the switched resistors associated with the inverter are preferably arranged to be activated in response to a fault in the grid, which may be a low of grid power.

In the preferred embodiments of the present invention, the second, neutral conductor is a relatively thin cable, i.e. of relatively small diameter, as compared with the cables used for the first and third cables. Thus, the amount of material used for the neutral conductor can be as lower as one half of that used for the other d.c. conductors. The reason for this is that, under normal operation of the wind turbine generator, the neutral conductor does not normally carry any significant level of current, and it is therefore advantageous to use less material so as to reduce both the cost and the weight of the material used, e.g. copper, for the neutral conductor.

However, in the event of a fault in which current is transmitted on the neutral conductor, the use of a thin cable can lead to dangerous levels of heating which could damage the cable and/or cable insulation and could give rise to a fire. This is particularly the case with high-power systems.

Although in the preferred embodiments of the present invention, the three d.c. conductors are each provided with at least one ammeter which would alert the control systems to shut down the wind turbine generator in the event of either a noticeable current in the neutral conductor or undesirably high currents in the first and/or third conductors, it would be desirable to provide a backup system which would provide an independent determination of a fault in the event of a failure of any of these ammeters.

Thus, in accordance with a further aspect of the present invention there is provided a system for determining the presence of a fault in a wind turbine generator which is arranged to generate a d.c. voltage across first and third conductors, and an intermediate d.c. voltage on a second, neutral conductor, and in which there is provided a current sensor for providing a measurement of the current in one of the first, second and third conductors, the system comprising: means for generating an estimated value of the current in said one conductor using at least one measurement made independently of the current sensor; and means for determining the presence of a fault in the wind turbine generator when the estimated value of the current meets a first predetermined criterion.

The system may be used to complement the functionality of existing ammeters in the wind turbine, and can be used as a backup in the event of the failure of a particular ammeter. The system thus functions to determine the presence of a fault when the estimated current in one of the conductors is indicative of a fault condition, such as the turbine operating outside an acceptable performance range. In this case damage to the wind turbine can be prevented.

The first predetermined criterion can be that the estimated value of the current is greater than a predetermined level. This would be of particular benefit when the current in the second, neutral conductor is being measured, since this current should normally be substantially zero. In this case, the predetermined level may be set at around 500 amps or 1,000 amps.

Alternatively, the first criterion can be that the difference between the estimated value of the current and the measurement provided by the current sensor is greater than a predetermined level. This criterion is useful when determining the current levels in any of the three d.c. conductors, since, when the ammeters are functioning correctly, there should be no substantial difference between the estimated current and the measured current in any of the three d.c. conductors. Any significant difference would be indicative of a fault in at least one of the ammeters.

A further alternative first criterion is that the sum of the estimated value of the current and the measurement provided by the current sensor is greater than a predetermined level. This is of particular benefit when the second, neutral conductor is considered, since the current in this conductor should be near, or equal to, zero. Any substantial deviation from this value should be detected by adding together the values of the estimated current and the directly measured current. If the ammeter is working correctly, the sum would be expected to be twice the actual current in the third conductor, and this feature therefore provides a particularly sensitive determination of the presence of a fault.

In preferred embodiments, the system further comprises means for determining the presence or a fault when at least one the following conditions is met: (a) the estimated value of the current meets said first predetermined criterion; and (b) the measurement provided by the current sensor meets a second predetermined criterion.

This provides a fail-safe system, in which the estimated current, the measured current, or both are used to determine the presence of a fault.

In this case, the second predetermined criterion may be that the estimated value of the current is greater than a predetermined level. This arrangement is of particular benefit when considering the current in the second, neutral conductor which should be close to zero at all times.

When the current in the second, neutral conductor is measured using an ammeter, the at least one independent measurement may comprise measurements of the currents in the first and third conductors, in which case the current in the second conductor may be estimated as the sum of the currents in the first and third conductors. In this case, the sign of the current is taken into account in performing the sum, such that the sum of currents of equal magnitude but flowing in opposite directions is equal to zero.

Alternatively, or in addition, the at least one measurement may include a measurement of the power transmitted by at least one of the first and third conductors.

In this case, the system may further comprise means for determining the presence of a fault when the difference between the measured power transmitted by the first and third conductors exceeds a predetermined value, since the magnitude of the current flowing in the first and third conductors should normally be the same, and hence also the power transmitted by the first and third conductors. This provides a further level of safety, and a backup in the event of a failure of the neutral conductor ammeter, which, when functioning normally, would detect the presence of current in the second conductor.

In this case, the current level can be determined from the measured power together with a measurement of the d.c. voltage across the first and third conductors.

The measurement provided by the current sensor may include a measurement of the current in one of the first and third conductors, and the current in said one of the first and third conductors may be estimated based on the power transmitted by said one of the first and third conductors.

Equally, the measurement provided by the current sensor may include a measurement of the current in the second, neutral conductor, and the current in the second conductor is estimated based on the difference between measurements of the power transmitted by the first and third conductors.

Alternatively, a simple calculation of the difference between these power measurements (which signifies the existence of a current in the neutral conductor) may be used to indicate a fault in the system that would otherwise be undetected in the event of a neutral conductor ammeter failure.

Conversely, the measured current in the first or third conductor may be used to provide an estimate of the power transmitted by that conductor, and the estimated value then compared with a measured value of power. In such an arrangement, the system is used to validate whether or not the measured level of current in one of the conductors is consistent with the measured power output by using the well-known relationship between power, voltage and current.

In the preferred embodiments, the above arrangements are combined to provide a multiple fail-safe backup, thus ensuring that a fault in one of the sensing systems does not give rise to a catastrophic failure of the wind turbine generator. In such a combination, many different types of system or sensor failure are be captured to ensure that a single failure does not lead to an overload of current in the neutral conductor, or to any other type of failure.

The system preferably furthers comprise means for shutting down operation of the wind turbine generator in response to the determination of a fault being present. Alternatively, or in addition, the system may further comprise means arranged to generate an alarm signal, which may be used to generate an audible and/or visual alarm, in response to the determination of a fault being present.

All of the above systems for estimating the current levels in one or more of the three d.c. conductors are preferably in constant use whenever the wind turbine generator is operational, to ensure that the systems are continuously monitored for faults.

In accordance with a further aspect of the present invention there is provided a method for determining the presence of a fault in a wind turbine generator which is arranged to generate a d.c. voltage across first and third conductors, and an intermediate d.c. voltage on a second, neutral conductor, and in which there is provided a current sensor for providing a measurement of the current in one of the first, second and third conductors, the method comprising: generating an estimated value of the current in said one conductor using at least one measurement made independently of the current sensor; and determining the presence or a fault in the wind turbine when the estimated value of the current lies outside a predetermined range.

Such indirect methods of determining the current levels in the d.c. conductors may be used in conjunction with the direct methods where the presence of a fault is determined in direct consequence to a sensor reading. Implementation of such indirect methods has the advantage that no additional hardware is required, since estimates can be generated on the basis of measurements which are already used in the various control systems.

The present invention will now be described with reference to the accompanying drawings, in which.

Figure 1:
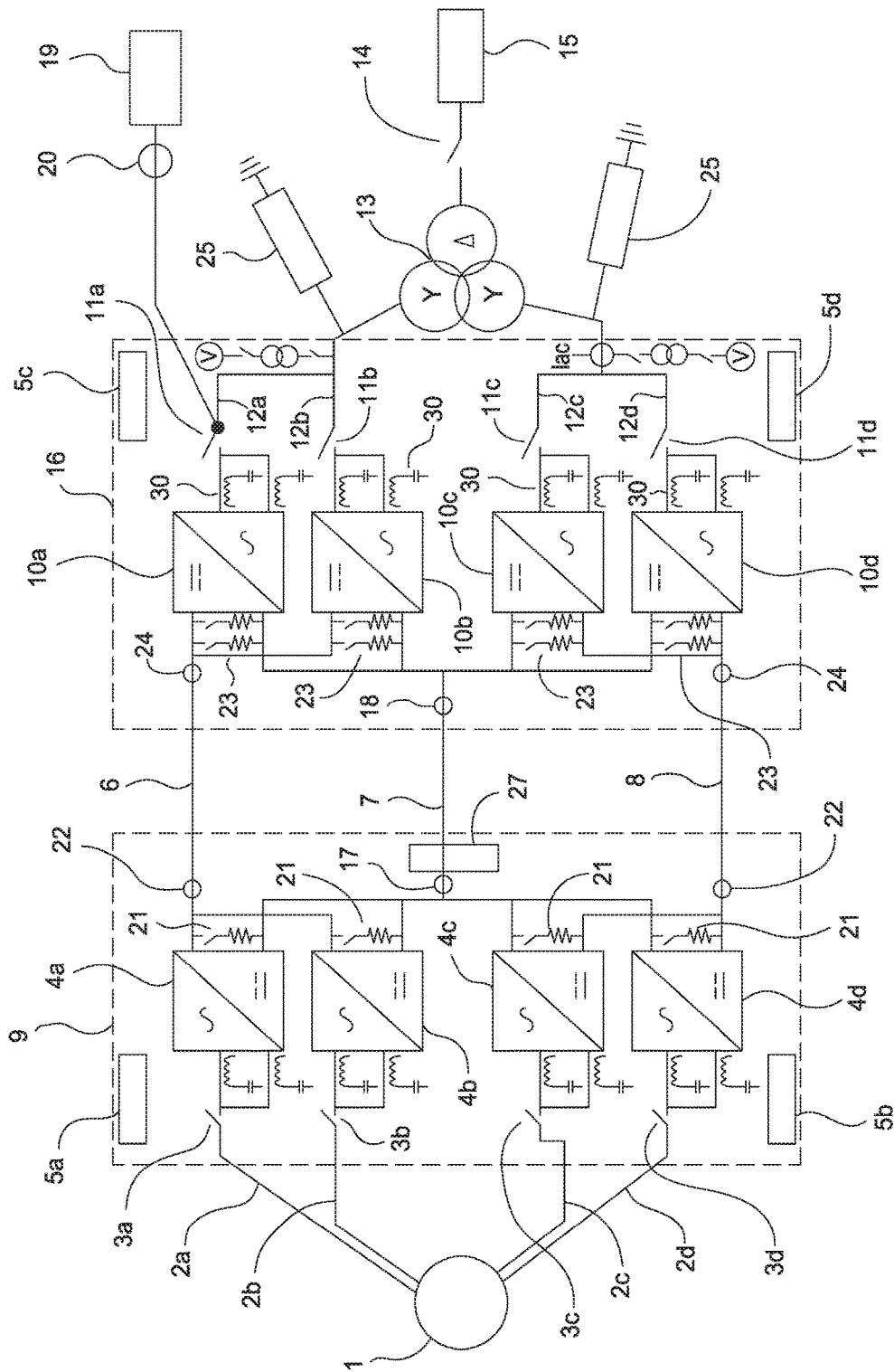
FIG. 1 is a schematic representation of the system in accordance with a preferred embodiment of the present invention.

Referring to FIG. 1, a wind turbine generator 1 is arranged to convert the rotation of the turbine blades caused by wind into electric power. The generated power is in the form of three-phase a.c. current. Current in each of the three phases is generated in four windings, and the resulting mutually isolated twelve windings are grouped into four bundles 2a, 2b, 2c, 2d, each bundle including three conductors bearing the three phases of the current. The four bundles 2a, 2b, 2c, 2d convey the three-phase a.c. current via four respective switches 3a, 3b, 3c, 3d to first, second, third and fourth substantially identical rectifiers 4a, 4b, 4c, 4d each of which uses conventional pulse-width modulation technology to convert the incoming three-phase a.c. current to a respective d.c. output current. The four rectifiers 4a, 4b, 4c, 4d are connected together as first and second pairs 4a, 4b and 4c, 4d. These rectifiers 4a, 4b, 4c, 4d can also operate in an inverter mode, providing reactive power to the generator 1 for terminal voltage control, and providing active power for torque control.

Thus, the two d.c. output terminals from the first rectifier 4a are connected to the two d.c. output terminals of the second rectifier 4b to form a first d.c. output, and the two d.c. terminals of the third rectifier 4c are connected to the two d.c. output terminals of the fourth rectifier 4d to form a second d.c. output.

The first pair of rectifiers 4a, 4b are controlled by a first controller 5a, and the second pair of rectifiers 4c, 4d are controlled by a second controller 5b. Although shown in the drawing as two separate controllers 5a, 5b, these could be combined into a single controller.

The first d.c. output is connected between a positive d.c. conductor 6 and a neutral d.c. conductor 7, and the second d.c. output is connected between the neutral conductor 7 and a negative d.c. conductor 8.

Thus, the d.c. voltage between the positive d.c. conductor 6 and the negative d.c. conductor 8 is twice the value of the d.c. voltage output of each of the rectifiers 4a, 4b, 4c, 4d.

The generator 1 and the four rectifiers 4a, 4b, 4c, 4d are all located inside a cabinet 9 within the nacelle of the wind turbine which is mounted at the top of the supporting tower.

The positive d.c. conductor 6, the neutral d.c. conductor 7 and the negative d.c. conductor 8 extend out of the nacelle and pass down the full height of the tower to the base. The ends of the positive d.c. conductor 6 and the neutral d.c. conductor 7 remote from the generator 1 are connected to the input terminals of a first pair of inverters 10a, 10b which convert the d.c. voltage into a three-phase a.c. voltage at the frequency of the mains grid, typically 50 Hz. Correspondingly, the ends of the neutral d.c. conductor 7 and the negative d.c. conductor 8 remote from the generator 1 are connected to the input terminals of a second pair of inverters 10c, 10d which also convert the d.c. voltage into a three-phase a.c. voltage at the same frequency. The first pair of inverters 10a, 10b are controlled by a third controller 5c, and the second pair of inverters 10c, 10d are controlled by a fourth controller 5d. Although shown in the drawing as two separate controllers 5a, 5b, these could be combined into a single controller.

The four rectifiers 4a, 4b, 4c, 4d and the four inverters 10a, 10b, 10c, 10d are all substantially identical in structure but are referred to herein as rectifiers and inverters because of their described function of converting from a.c. to d.c. and from d.c. to a.c. respectively. However, the inverters 10a, 10b, 10c, 10d can also function as rectifiers, and the rectifiers 4a, 4b, 4c, 4d can also function as inverters, when power is supplied to the wind turbine from the mains, i.e. when the wind turbine is acting as a motor.

Each rectifier and inverter includes within its circuitry respective dc-link capacitor banks for storing electrical energy.

The three-phase a.c. output power from the four inverters 10a, 10b, 10c, 10d is supplied respectively via switches 11a, 11b, 11c, 11d to first, second, third and fourth conductor bundles 12a, 12b, 12c, 12d, each bundle including three mutually isolated conductors for the three separate phases. The three conductors within the first bundle 12a are each connected to the respective conductor having the same phase within the second bundle 12b and transmit a.c. power to three respective transformers 13. The three conductors within the third bundle 12c are likewise connected to the respective conductor having the same phase within the fourth bundle 12d and also transmit a.c. power to the three respective transformers 13. Each transformer 13 steps up the a.c. voltage of its respective phase to the level required by the grid. The output of the transformers 13 are then connected via tower switchgear 14 to the mains grid 15.

The four inverters 10a, 10b, 10c, 10d and the four conductor bundles 12a, 12b, 12c, 12d are all located in a cabinet 16 inside the base of the tower remote from the nacelle, and the transformers 13 are also located within the base of the tower.

The four rectifier switches 3a, 3b, 3c, 3d and the four inverter switches 11a, 11b, 11c, 11d provide a convenient means of selectively isolating any rectifier or inverter which develops a fault. Thus, should a fault occur in the first rectifier 4a, two of the rectifier switches 3a, 3c are opened so as to disconnect both the first and the third rectifiers 4a, 4c, leaving the second and fourth rectifiers 4b, 4d to function normally. Although the power handling capability would be reduced in the event of such a fault, the system would still remain operational. In such an event, it may also be desirable to disconnect the corresponding first and third inverters 10a, 10c by opening the associated switches 11a, 11c, leaving the second the fourth inverters 10b, 10d to function normally.

Equally, should a fault occur within one of the four inverters, e.g. 10a, then both the first and third inverters 10a, 10c are disconnected by opening the associated switches 11a, 11c, leaving the second and fourth inverters to function normally. Again, in such an event, it may be desirable to disconnect the corresponding first and third rectifiers 4a, 4c.

It is possible for there to be an imbalance in the current flowing in the positive and negative d.c. conductors 6, 8. This could result, for example, from small differences in the functioning of the first and second controllers 5a, 5b and/or the rectifiers 4a, 4b, 4c, 4d, such as differences in the timing control within the controllers 5a, 5b and differences in the sensitivity of the sensors which are used for feedback control within the rectifiers 4a, 4b, 4c, 4d. Such an imbalance would give rise to a small "difference" current to flow within the neutral d.c. conductor, which is undesirable. To overcome this, any current flowing in the neutral d.c. conductor 7 is measured using an ammeter 17 located within the nacelle cabinet 9 which generates a signal which is supplied to the associated controllers 5a, 5b. Any such current is eliminated, or at least substantially reduced, by way of negative feedback servo-control by appropriate adjustment of the relative levels of d.c. current produced within the rectifiers 4a, 4b, 4c, 4d.

Similarly, when the wind turbine generator 1 is acting as a motor powered by the grid, any current appearing on the neutral d.c. conductor 7 resulting from current imbalance on the positive and negative d.c. conductors 6, 8 arising out of the functioning of the third and fourth controllers 5c, 5d and/or inverters 10a, 10b, 10c, 10d (now acting as rectifiers) is detected using an ammeter 18 located within the tower cabinet 16, and the level of d.c. current produced with the inverters 10a, 10b, 10c, 10d can be controlled in like manner using as a control signal the output of the ammeter 18 which is supplied to the controllers 5c, 5d.

A difference between the level of current flowing in the positive and negative d.c. conductors 6, 8 may also result when power is removed from the output of one of the inverters, e.g. 10a to energise the auxiliary circuits 19 used by the wind turbine generator which are typically housed in the base of the tower. In this case, the amount of power used by the auxiliary circuits 19 is measured using a wattmeter 20, which supplies a corresponding signal to the rectifier controllers 5a, 5b and inverter controllers 5c, 5d. In turn, the first and second controllers 5a, 5b adjust the levels of d.c. current flowing in the positive and negative d.c. conductors 6, 8 and the third and fourth controllers 5c, 5d adjust the levels of the output power of the inverters 10a, 10b, 10c, 10d to compensate for the reduction in effective output power from the inverter 10a.

As can be seen from the drawing, across the d.c. output of each of the four rectifiers 4a, 4b, 4c, 4d there is provided a respective switched resistance 21, or chopper resistance which functions to provide a selective short circuit in the event of excessive d.c. voltages appearing on the d.c. conductors resulting from the self-inductance of the d.c. conductors. These are controlled by the controller, e.g. 5a, associated with the respective rectifier, e.g. 4a, in dependence on the magnitude of the d.c. current and/or voltage within the d.c. conductors as measured by ammeters 22 located within the nacelle cabinet 9.

Corresponding switched resistances 23 are provided across the d.c. input terminals of the four inverters 10a, 10b, 10c, 10d and have the same function as those provided across the d.c. terminals of the rectifiers 4a, 4b, 4c, 4d. These are correspondingly controlled by the controller, e.g. 5c, associated with the respective inverter, e.g. 10a, in dependence on the magnitude of the d.c. current and/or voltage within the positive and negative d.c. conductors 6, 8 as measured by ammeters 24 located in the cabinet 16 in the base of the tower. However, as indicated schematically in the drawing by a parallel connection of two switched resistances, the value of each of the resistances 23 connected across the d.c. input terminals of the inverters 10a, 10b, 10c, 10d is substantially greater than, e.g. twice, that of each of the resistances 21 connected across the d.c. output terminals of the rectifiers 4a, 4b, 4c, 4d. This arrangement provides two advantages. Most of the weight of the switched resistors 21, 23 is located at the base of the tower, which reduces the torsional stress in the nacelle when it rotates about its vertical axis. Furthermore, most of the heat dissipation from the resistors 21, 23 occurs in the base of the tower, and not within the nacelle, which reduces the risk of fire.

In the event of low-wind, or no-wind, conditions, the switches 11a, 11b, 11c, 11d are activated so as to isolate the wind turbine generator 1 from the grid 15. However, this also causes the conductor bundles 12a, 12b, 12c and 12d and the transformers 13 to be disconnected from the controllers 5a, 5b, 5c, 5d, and this part of the circuitry can therefore remain at high voltage. In the event of a short circuit to earth, which is not detected by the controllers 5a, 5b, 5c, 5d, this could cause a fire or cause injury to service personnel. To overcome this problem, two isolation detection relays 25 are connected between the conductor bundles 12a, 12b, 12c, 12d and earth. In the event of a short circuit between the conductor bundles 12a, 12b, 12c, 12d and earth, the resulting low resistance is detected by the relays 25, and a suitable alert signal is generated.

In order to reduce high-frequency common-mode noise resulting from the high-frequency switching within the rectifiers 4a, 4b, 4c, 4d and inverters 10a, 10b, 10c, 10d, which is described above in greater detail, two measures are employed, each of which makes use of the neutral d.c. conductor 7.

Figure 2:
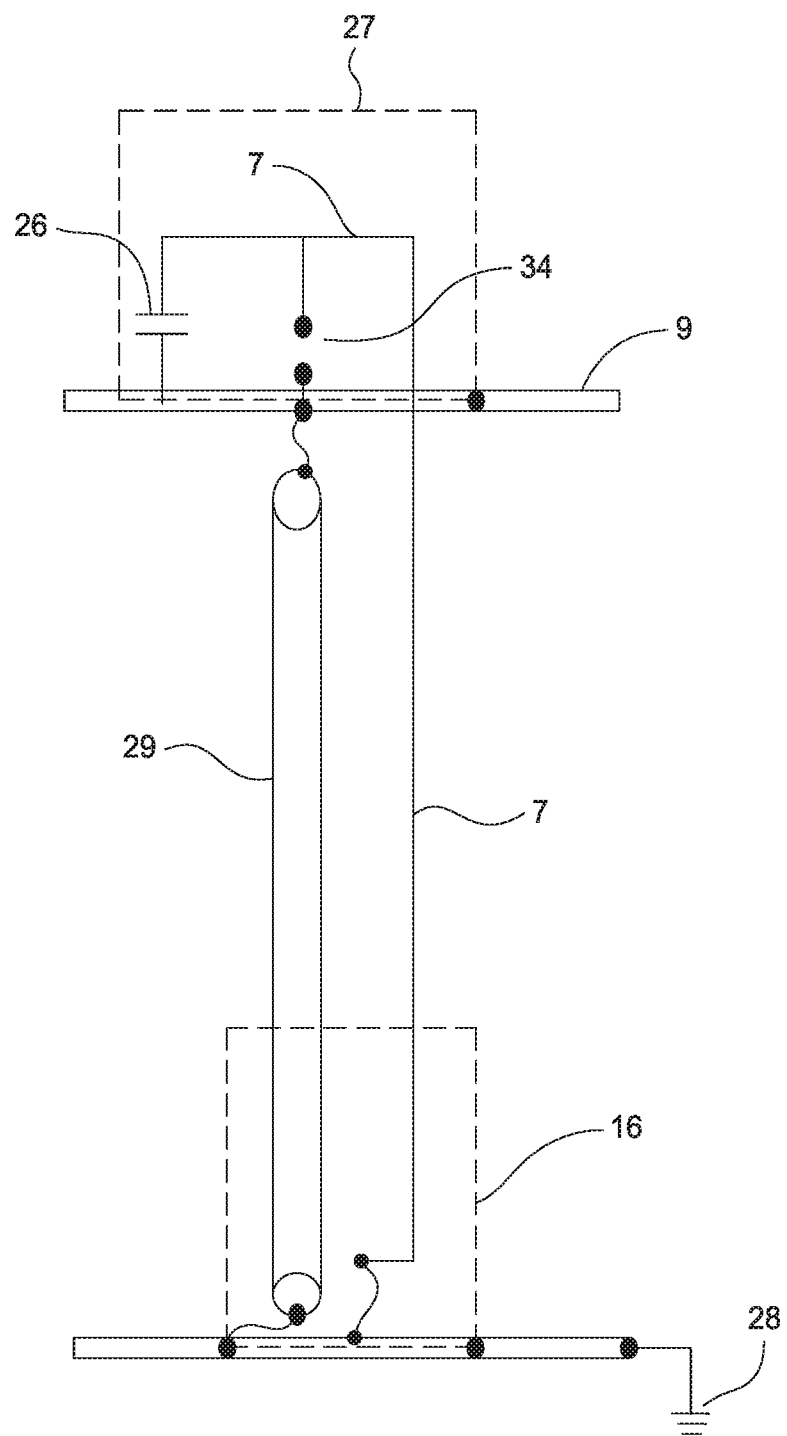
FIG. 2 is a detailed schematic representation of grounding arrangements in accordance with preferred embodiments of the present invention.

Firstly, referring to FIG. 2, there is provided a first capacitor 26 located within a module 27 in the nacelle cabinet 9 which is connected between the neutral d.c. conductor 7 and earth 28 via the tower 29, which provides a low-impedance path for the undesirable common-mode noise, while acting as a block against the flow of d.c. current to earth which would give rise to accelerated galvanic corrosion within the nacelle.

Figure 3:
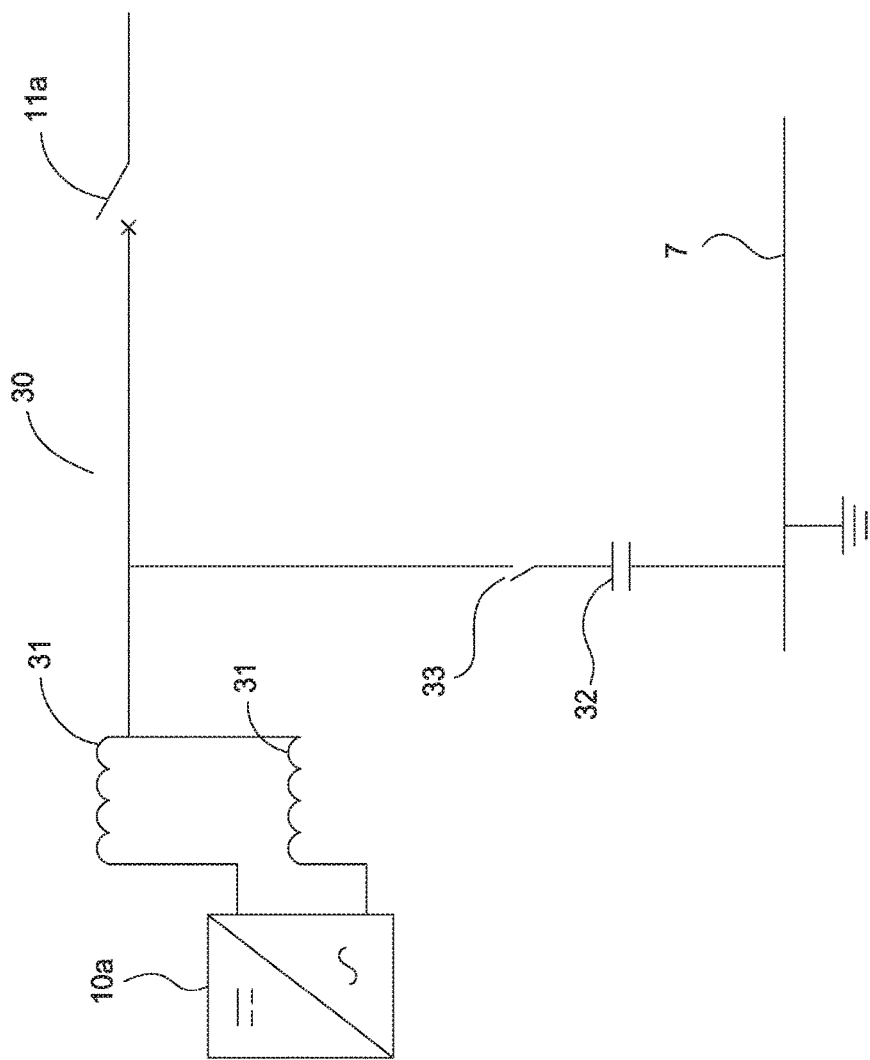
FIG. 3 is a schematic circuit diagram of an arrangement for reducing common-mode noise in accordance with a preferred embodiment of the present invention.

Secondly, referring to FIG. 3, a respective filter circuit 30 is connected to each phase of the a.c. output of each of the four inverters 10a, 10b, 10c, 10d. Each filter circuit 30 comprises a differential-mode inductance in the form of first and second inductors 31 connected in parallel. There are thus four such pairs of inductors 31 connected respectively to the four conductor bundles 12a, 12b, 12c, 12d. Conventionally, two separate inductors are arranged at the outputs of inverters and function not only to balance internal currents within the inverters so as to reduce recirculating currents, but also to reduce the level of ripple in the a.c. current supplied to the grid 15. However, in the preferred embodiment, these first and second inductors 31 are arranged within a single module to allow for inductive coupling, and it is the resulting effective inductance created by the resulting three-phase inductor (created by the three modules, with one module for each phase), which gives rise to a common-mode inductance which contributes to the desired filtering of the common-mode noise. Each module containing the first and second inductors 31 is connected to a respective second capacitor 32 which, in turn, is connected to the neutral d.c. conductor 7. In one arrangement, as illustrated in FIG. 3, the neutral d.c. conductor is earthed at the base of the tower, to provide a further low-impedance path for the common-mode noise. A switch 33 is provided to selectively block the second capacitor 32.

Referring back to FIG. 2, there is provided a surge protection device 34 within the module 27 in the nacelle cabinet 9, which also makes use of the presence of a neutral d.c. conductor 7. The surge protection device 34 acts to prevent damage to the circuitry in the event of a voltage surge, such as could be generated by lightning. The surge protection device 34 is connected between the neutral d.c. conductor 7 and earth and takes the form of a layer of metal oxide semiconductor which provides a low-resistance current path in the event of a current surge arising within the neutral d.c. conductor 7.

In some of the arrangements described above, use is made of the neutral d.c. conductor which arises in the preferred embodiment from the presence of more than one rectifier where the d.c. outputs are connected in series, which not only increases the level of the d.c. voltage but also creates a neutral d.c. conductor (by connecting together the positive output of one of the rectifiers with the negative output of another).

However, there are known arrangements in which a neutral d.c. conductor is created using only a single rectifier and a single inverter, for example, by incorporating suitable circuitry at the output of the rectifier. It will be apparent that the provision of a capacitor or other suitable filter circuit between the neutral d.c. conductor and earth to reduce common-mode noise, as described above, can be applied to such systems.

It will further be apparent that the presence of a neutral d.c. conductor can be used as a means of detecting any imbalance between the currents flowing in the positive and negative d.c. conductors in a cost-effective manner, which can be sensed so as to control the rectifiers and/or inverters to compensate such imbalance.

Furthermore, since the voltage level of the neutral d.c. conductor is usually close to earth, this provides a means of detecting the presence of an abnormally high voltage. In such case, a conductive path can be provided between the neutral conductor and earth. Such a conductive path may be passively controlled, e.g. by the provision of a semiconductor material between the neutral conductor and earth, or actively controlled, e.g. by means of a switched resistance which acts in response to a signal indicative of the high voltage.

In addition, in systems wherein the power generated in a wind turbine generator is supplied as two separate outputs and where auxiliary circuits within the wind turbine generator are powered from only one of the outputs, this would give rise to an imbalance between the power levels supplied by the two outputs. If these imbalanced a.c. outputs are then converted to two respective d.c. voltages, with the first d.c. voltage appearing across a first, positive, conductor and a second, neutral, conductor, the second d.c. voltage appearing across the second, neutral conductor and a third, negative, conductor, the magnitude of the current in the positive conductor will be different from that in the negative conductor. In this case, means are provided for measuring the power supplied to the auxiliary circuits and, in response thereto, controlling the conversion of at least one of the a.c. voltage outputs to at least partially balance the d.c. current supplied along the positive and negative conductors.

Referring back to FIG. 1, in addition to the direct method of measuring the current in the d.c. conductors 6, 7, 8 using ammeters 17, 18, 22, 24, a number of indirect methods are also used to provide a backup in the event of ammeter failure, or as a supplement to the information provided by the ammeter. In one indirect method, the power transmitted by each of the positive and negative d.c. conductors 6, 8 is measured at the low-voltage side of the transformer 13 by respective power meters. Any difference between the measured values is indicative of power, and hence current, being transmitted on the neutral d.c. conductor which indicates the presence of a fault. Thus, if the difference is greater than a predetermined threshold, the system is arranged to shut off the wind turbine generator and to generate an alarm to alert service personnel to rectify the fault.

Alternatively, or in addition, the power transmitted by the positive and negative conductors 6, 8 is measured, and the measurements used, in conjunction with the d.c. voltage across the positive and negative d.c. conductors 6, 8 to provide an estimate of the current in each of the positive and negative conductors 6, 8. These estimated values are then compared with the current in the positive and negative conductors 6, 8 as measured by the ammeters 22, 24. Any difference between the estimated and measured values would be indicative of an ammeter fault and would again cause the system to shut down the wind turbine generator.

Alternatively, or in addition, a determination is made as to whether estimated values of current in the positive and negative conductors 6, 8 are within an expected or predetermined range of values. Again, the determination of the presence of a fault results in the wind turbine generator being shut down and an audible and/or visual alarm being activated.

As described above, when the wind turbine generator 1 is acting as a motor powered by the grid, then the level of current flowing in the neutral d.c. conductor 7 is measured by ammeter 18.

In another method, the level of (positive) current flowing in the positive d.c. conductor 6 is added to the level of (negative) current flowing in the negative d.c. conductor 8, as measured by ammeters 22 and/or 24. The resulting value provides an estimated or expected level of current in the neutral d.c. conductor 7 where, in an ideal system, the expected value would be zero. If the resulting estimated value is greater than a prescribed threshold value, or outside a prescribed range, then a fault is determined to be present. Alternatively, a fault is determined to be present if the estimated value deviates too much from the level of current in the neutral d.c. conductor 7 as measured by ammeter 17 or 18.

In a further method, the levels of current flowing in the positive, negative and neutral d.c. conductors 6, 7, 8 are summed, and if the calculated value lies outside a prescribed range then a fault is determined to be present. This method is useful for detecting a leakage current in one of the conductors or for determining that one or more of the ammeters 17, 18, 22, 24 are faulty.

In yet a further method, an estimated level of current in either the positive d.c. conductor 6 or the negative d.c. conductor 8 is determined by measuring the power output at the low-voltage side of the transformer 13 and dividing this value of power output by the d.c. output voltage of the appropriate conductor. If the difference between the estimated current and the current as measured by the ammeters 22 and/or 24 is greater than a predetermined acceptable error, then a fault is determined to be present. This method is useful for validating the readings of the ammeters 22, 24.

The above-described methods are implemented by controllers 5a, 5b, 5c, 5d and, further, in the event that a fault is determined to be present, the controllers 5a, 5b, 5c, 5c command the wind turbine generator 1 to be inactivated and generate an alarm signal.

It will be appreciated that the above indirect methods of determining current levels in the d.c. conductors are examples of indirect methods and that others are possible. It will also be appreciated that such indirect methods may be implemented in a system individually or in combination, and may further be implemented in addition to, or alternatively to, direct methods.

Although the present invention has been described with reference to specific preferred embodiments, it will be apparent that numerous modifications and arrangements can be made without departing from the scope of the invention which is defined by the following claims.

What is claimed is:

1. A system for converting an alternating current (AC) output from a generator of a wind turbine, the system comprising:
    a first rectifier and a second rectifier of the wind turbine, each rectifier connected to the AC output of the generator and arranged to generate a respective direct current (DC) output, wherein:
        a positive DC level output from the first rectifier is applied to a first, positive DC conductor;
        a negative DC level output from the first rectifier is connected together with a positive DC level output from the second rectifier and applied to a second, neutral DC conductor; and
        a negative DC level output from the second rectifier is applied to a third, negative DC conductor, the first, second, and third DC conductors being arranged to transmit the resulting DC voltages; and
    a controller configured to, responsive to sensing a presence of current flowing in the second DC conductor, control the rectifiers to balance current flowing in the first DC conductor and the third DC conductor, wherein the current in the second DC conductor is reduced.

2. A system as claimed in claim 1, further comprising:
    a third rectifier and a fourth rectifier of the wind turbine, each rectifier connected to the AC output of the generator and arranged to generate a respective DC output, wherein the DC output of the third rectifier is connected to the DC output of the first rectifier and the DC output of the fourth rectifier is connected to the DC output of the second rectifier.

3. A system as claimed in claim 1, further comprising: switching elements for selectively disconnecting each rectifier from the AC output of the generator.

4. A system as claimed in claim 1, further comprising:
a first inverter configured to convert the DC output of the first rectifier to a first AC output having a predetermined frequency and voltage; and
a second inverter configured to convert the DC output of the second rectifier to a second AC output having a predetermined frequency and voltage.

5. A system as claimed in claim 4, further comprising switching elements for selectively disconnecting each inverter from an electrical grid.

6. A system for converting an alternating current (AC) output from a generator of a wind turbine, the system comprising:
a first rectifier and a second rectifier of the wind turbine, each rectifier connected to the AC output of the generator and arranged to generate a respective direct current (DC) output, wherein:
a positive DC level output from the first rectifier is applied to a first, positive DC conductor;
a negative DC level output from the first rectifier is connected together with a positive DC level output from the second rectifier and applied to a second, neutral DC conductor; and
a negative DC level output from the second rectifier is applied to a third, negative DC conductor, the first, second, and third DC conductors being arranged to transmit the resulting DC voltages;
a first inverter configured to convert the DC output of the first rectifier to a first AC output having a predetermined frequency and voltage;
a second inverter configured to convert the DC output of the second rectifier to a second AC output having a predetermined frequency and voltage, wherein the first AC output is configured to supply power to auxiliary circuits of the wind turbine such that the power available for delivery from the first AC output to an electrical grid is less than the power available for delivery from the second AC output; and
a controller configured to, responsive to a measurement of the power supplied to the auxiliary circuits, control at least one of the first rectifier, the second rectifier, the first inverter, and the second inverter to improve a balance of AC power levels supplied to the electrical grid from the first AC output and the second AC output.

7. A system as claimed in claim 1, further comprising:
circuitry defining a low-impedance path between the neutral DC conductor and earth which substantially blocks DC current.

8. A system as claimed in claim 7, wherein the circuitry defining the low-impedance path comprises a capacitor.

9. A system as claimed in claim 1, further comprising a surge protection device connected between the neutral DC conductor and earth.

10. A system as claimed in claim 9, wherein the surge protection device comprises a switching element defining a current path only when the voltage of the neutral DC conductor exceeds a predetermined level.

11. A system for converting an alternating current (AC) output from a generator of a wind turbine, the system comprising:
a first rectifier and a second rectifier of the wind turbine, each rectifier connected to the AC output of the generator and arranged to generate a respective direct current (DC) output, wherein:
a positive DC level output from the first rectifier is applied to a first, positive DC conductor;
a negative DC level output from the first rectifier is connected together with a positive DC level output from the second rectifier and applied to a second, neutral DC conductor; and
a negative DC level output from the second rectifier is applied to a third, negative DC conductor, the first, second, and third DC conductors being arranged to transmit the resulting DC voltages;
a first inverter configured to convert the DC output of the first rectifier to a first AC output having a predetermined frequency and voltage; and
a second inverter configured to convert the DC output of the second rectifier to a second AC output having a predetermined frequency and voltage,
wherein a respective switched resistance is provided across DC terminals of each of the first rectifier, the second rectifier, the first inverter, and the second inverter, wherein magnitudes of the switched resistances of the first inverter and the second inverter are substantially greater than magnitudes of the switched resistances of the first rectifier and the second rectifier.

12. A system as claimed in claim 4, further comprising a filter circuit connected to the neutral DC conductor.

13. A system as claimed in claim 4, in which circuitry normally connecting the AC outputs of the inverters to an electrical grid is arranged to be isolated from the inverters under predetermined conditions, the system further comprising:
a controller configured to, responsive to detecting a short circuit between the circuitry and earth, generate an alarm signal.

14. A system as claimed in claim 1, further comprising:
noise-reducing circuitry electrically connected to the second, neutral DC conductor for reducing high-frequency common-mode noise on the second, neutral DC conductor by providing an AC conductive path between the second, neutral DC conductor and earth which substantially blocks the passage of DC current.

15. A system as claimed in claim 14, wherein the noise-reducing circuitry comprises a capacitor connected between the second, neutral DC conductor and earth.

16. A system as claimed in claim 14 further comprising an inverter for converting a DC voltage of a rectifier to an AC output, wherein the noise-reducing circuitry comprises a filter circuit connected between the AC output of the inverter and the second, neutral DC conductor.

17. A system as claimed in claim 1, further comprising:
a controller configured to, responsive to sensing a presence of an abnormally high voltage on the second, neutral DC conductor, provide a conductive path between the second, neutral DC conductor and earth.

18. The system of claim 4,
wherein the wind turbine comprises a nacelle mounted at the top of a tower,
wherein the generator, the first rectifier, and the second rectifier are arranged in the nacelle, and
wherein the first inverter and the second inverter are remote from the nacelle.

19. The system of claim 18, wherein the first inverter and the second inverter are arranged in a base of the tower.

20. The system of claim 19, wherein a plurality of transformers coupled with the first AC output and the second AC output are arranged in the base.

\* \* \* \* \*